United States Patent
Ji

(10) Patent No.: US 10,476,024 B2
(45) Date of Patent: Nov. 12, 2019

(54) ORGANIC LIGHT EMITTING DIODE DISPLAY SUBSTRATE AND DISPLAY DEVICE

(71) Applicant: BOE TECHNOLOGY GROUP CO., LTD., Beijing (CN)

(72) Inventor: Chunyan Ji, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/521,808

(22) PCT Filed: Sep. 8, 2016

(86) PCT No.: PCT/CN2016/098377
§ 371 (c)(1),
(2) Date: Apr. 25, 2017

(87) PCT Pub. No.: WO2017/118071
PCT Pub. Date: Jul. 13, 2017

(65) Prior Publication Data
US 2018/0301656 A1    Oct. 18, 2018

(30) Foreign Application Priority Data
Jan. 6, 2016  (CN) .......................... 2016 1 0008201

(51) Int. Cl.
*H01L 29/08*    (2006.01)
*H01L 51/52*    (2006.01)
*H01L 27/32*    (2006.01)

(52) U.S. Cl.
CPC ...... *H01L 51/5209* (2013.01); *H01L 27/3211* (2013.01); *H01L 51/5225* (2013.01);
(Continued)

(58) Field of Classification Search
CPC . H01L 51/52; H01L 51/5225; H01L 51/5262; H01L 52/5265
See application file for complete search history.

(56) References Cited

U.S. PATENT DOCUMENTS

2003/0062520 A1    4/2003  Toguchi et al.
2012/0001186 A1    1/2012  Kondoh et al.
(Continued)

FOREIGN PATENT DOCUMENTS

| CN | 1411325 | 4/2003 |
|---|---|---|
| CN | 102263179 | 11/2011 |

(Continued)

OTHER PUBLICATIONS

First Office Action for Chinese Application No. 201610008201.5, dated Jan. 19, 2018, 7 Pages.
(Continued)

*Primary Examiner* — Phuc T Dang
(74) *Attorney, Agent, or Firm* — Brooks Kushman P.C.

(57) ABSTRACT

An OLED display substrate and a display device are provided. The OLED display substrate includes a plurality of sub-pixel regions corresponding to different colors arranged on a substrate. Each sub-pixel region includes a thin film transistor, an anode, a light-emitting layer and a cathode arranged successively in a direction away from the substrate, and a microcavity structure is formed between the anode and the cathode. The anode includes a hollowed-out portion, the light-emitting layers of the sub-pixel regions corresponding to different colors are of different thicknesses, or the anodes of the sub-pixel regions corresponding to different colors are of different thicknesses.

17 Claims, 3 Drawing Sheets

(52) U.S. Cl.
CPC ...... *H01L 51/5262* (2013.01); *H01L 51/5265* (2013.01); *H01L 51/5275* (2013.01)

(56) References Cited

U.S. PATENT DOCUMENTS

| | | | | |
|---|---|---|---|---|
| 2012/0187386 A1* | 7/2012 | Matsumi | ............ | H01L 51/5012 257/40 |
| 2013/0320308 A1 | 12/2013 | Lee et al. | | |
| 2015/0034925 A1 | 2/2015 | Shinotsuka et al. | | |
| 2016/0079327 A1* | 3/2016 | Matsumi | ............ | H01L 51/5265 257/40 |
| 2016/0343788 A1 | 11/2016 | Zou et al. | | |

FOREIGN PATENT DOCUMENTS

| | | |
|---|---|---|
| CN | 102405687 | 4/2012 |
| CN | 103456761 | 12/2013 |
| CN | 103837918 | 6/2014 |
| CN | 104335679 | 2/2015 |
| CN | 104538428 | 4/2015 |
| CN | 105609534 | 5/2016 |
| CN | 205264706 | 5/2016 |
| JP | 5126653 | 1/2013 |

OTHER PUBLICATIONS

International Search Report and Written Opinion for Application No. PCT/CN2016/098377, dated Dec. 7, 2016, 9 pages.

* cited by examiner

ORGANIC LIGHT EMITTING DIODE DISPLAY SUBSTRATE AND DISPLAY DEVICE

CROSS-REFERENCE TO RELATED APPLICATIONS

This application is the U.S. national phase of PCT Application No. PCT/CN2016/098377 filed on Sep. 8, 2016, which claims priority to Chinese Patent Application No. 201610008201.5 filed on Jan. 6, 2016, the disclosures of which are incorporated in their entirety by reference herein.

TECHNICAL FIELD

The present disclosure relates to the field of display technology, and in particular to an organic light emitting diode (OLED) display substrate and a display device.

BACKGROUND

As various wearable products spring up, OLED display equipments are attracting more and more attention due to the ultra color quality and an unlimited potential of becoming lighter and thinner. The OLED display equipments have such advantages as emitting light actively, light-weight, a wide field of view, a high contrast ratio, a fast response speed and low power consumption and full-color display.

People usually read books or operate on the OLED display equipments outdoors. However, since the OLED display equipments adopt metal electrodes, the reading experience in strong light is bad. Generally, a polarizer is attached onto a surface of the OLED display equipment to eliminate the effect of ambient light. However, the polarizer may absorb about half of the light beams emitted by the OLED display equipment, such that the light utilization of the OLED display equipment may be reduced.

SUMMARY

An object of the present disclosure is to provide an OLED display substrate and a display device, so as to reduce the effect of ambient light without a polarizer and increase the light utilization of the OLED display equipment.

To this end, the present disclosure provides the following technical solutions.

In one aspect, an OLED display substrate is provided. The OLED display substrate includes a plurality of sub-pixel regions corresponding to different colors formed on a substrate. Each sub-pixel region includes a thin film transistor (TFT), an anode, a light-emitting layer and a cathode arranged successively in a direction away from the substrate, and a microcavity structure is formed between the anode and the cathode. The anode includes a hollowed-out portion, the light-emitting layers of the sub-pixel regions corresponding to different colors are of different thicknesses, or the anodes of the sub-pixel regions corresponding to different colors are of different thicknesses.

Optionally, the hollowed-out portion is slit-like.

Optionally, the anode is of a Bragg diffraction grating structure.

Optionally, the light-emitting layers of the sub-pixel regions corresponding to different colors are of different thicknesses, and the anodes of the sub-pixel regions corresponding to different colors are of an identical thickness; or the light-emitting layers of the sub-pixel regions corresponding to different colors are of an identical thickness, and the anodes of the sub-pixel regions corresponding to different colors are of different thicknesses.

Optionally, the anode is of a grating structure, the grating structures of the sub-pixel regions corresponding to different colors are of different periods and widths, the width of the grating structure of the sub-pixel region is in direct proportion to a wave length of light of the color corresponding to the sub-pixel region, and the period of the grating structure of the sub-pixel region is in direct proportion to the wave length of light of the color corresponding to the sub-pixel region.

Optionally, the cathode is of a Bragg diffraction grating structure.

Optionally, the plurality of sub-pixel regions corresponding to different colors arranged on the substrate includes a red sub-pixel region, a green sub-pixel region and a blue sub-pixel region. The width of the grating structure of each of the red sub-pixel region, the green sub-pixel region and the blue sub-pixel region is in a range from 80 nanometers to 300 nanometers, and the period of the grating structure of each of the red sub-pixel region, the green sub-pixel region and the blue sub-pixel region is in a range from 200 nanometers to 500 nanometers.

Optionally, a depth-width ratio of the grating structure of the red sub-pixel region is greater than a depth-width ratio of the grating structure of the green sub-pixel region, and the depth-width ratio of the grating structure of the green sub-pixel region is greater than a depth-width ratio of the grating structure of the blue sub-pixel region.

Optionally, the grating structure of each of the red sub-pixel region, the green sub-pixel region and the blue sub-pixel region is of a depth in a range from 80 nanometers to 200 nanometers.

Optionally, the anode is made of an alloy of silver and molybdenum.

A display device including the above-mentioned OLED display substrate hereinabove is further provided in the present disclosure.

An OLED display substrate is further provided in the present disclosure. The OLED display substrate includes a base substrate and a plurality of sub-pixel regions corresponding to different colors arranged on the base substrate. Each sub-pixel region includes a thin film transistor (TFT), an anode, a light-emitting layer and a cathode arranged successively in a direction away from the substrate, and a microcavity structure is formed between the anode and the cathode. The anode includes a hollowed-out portion, and sums of a thickness of the light-emitting layer and a thickness of the anode of the sub-pixel regions respectively corresponding to different colors are different.

Optionally, the light-emitting layers of the sub-pixel regions corresponding to different colors are of different thicknesses, and the anodes of the sub-pixel regions corresponding to different colors are of an identical thickness.

Optionally, the light-emitting layers of the sub-pixel regions corresponding to different colors in a same pixel unit are spaced from each other.

Optionally, the anodes of the sub-pixel regions corresponding to different colors in a same pixel unit are spaced from each other.

Optionally, the light-emitting layers of the sub-pixel regions corresponding to different colors in a same pixel unit are discontinuous.

Optionally, the light-emitting layers of the sub-pixel regions corresponding to different colors are of an identical thickness, and the anodes of the sub-pixel regions corresponding to different colors are of different thicknesses.

According to the present disclosure, the microcavity structure is formed between the anode and the cathode of the OLED display substrate, the light-emitting layers of the sub-pixel regions corresponding to different colors are of different thicknesses or the anodes of the sub-pixel regions corresponding to different colors are of different thicknesses, and each anode is provided with the hollowed-out portion, thereby reducing the reflection of ambient light by the metal electrodes without the polarizer, and then increasing the light utilization of the OLED display substrate. In addition, the luminance of the microcavity structure may change with the viewing angle, so people around the user cannot see the displayed content, thereby guaranteeing the privacy of the display.

Figure 1:
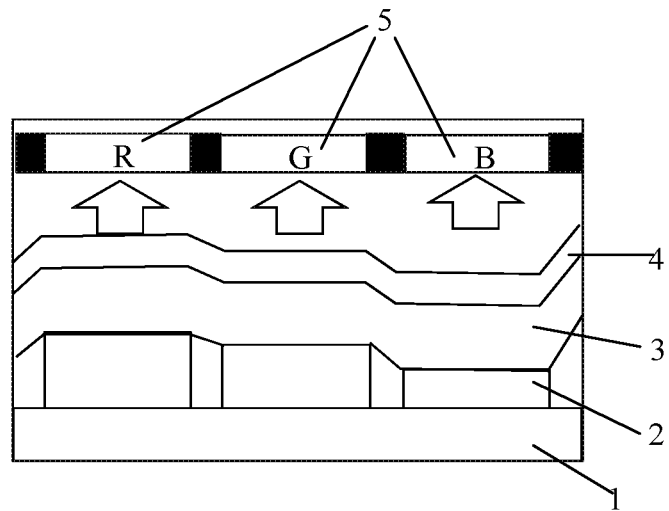
FIG. 1 is a schematic diagram of an OLED display substrate in the related art.

REFERENCE NUMERALS 1. first base substrate; 2. anode; 3. light-emitting layer; 4. cathode; 5. color filter; 6. second base substrate; 7. hollowed-out portion

DETAILED DESCRIPTION

In order to make the technical problems, the technical solutions and the advantages of the present disclosure more clear, the present disclosure will be described in detail hereinafter in conjunction with the drawings and embodiments.

In view of the low light utilization of the OLED display equipment in the related art, an OLED display substrate and a display device are provided in the present disclosure, so as to reduce the effect of ambient light without a polarizer and increase the light utilization of the OLED display equipment.

An OLED display substrate is provided in some embodiments of the present disclosure, including a plurality of sub-pixel regions corresponding to different colors arranged on a substrate. Each sub-pixel region includes a thin film transistor (TFT), an anode, a light-emitting layer and a cathode arranged successively in a direction away from the substrate, and a microcavity structure is formed between the anode and the cathode. The anode includes a hollowed-out portion, the light-emitting layers of the sub-pixel regions corresponding to different colors are of different thicknesses, or the anodes of the sub-pixel regions corresponding to different colors are of different thicknesses.

In the OLED display substrate in some embodiments, the light-emitting layer between the anode and the cathode forms an optical microcavity (microcavity structure for short). The microcavity structures of the sub-pixel regions corresponding to different colors are of different cavity lengths. The light-emitting layers of the sub-pixel regions corresponding to different colors are of different thicknesses, or the anodes of the sub-pixel regions corresponding to different colors are of different thicknesses. In addition, the anode includes a hollowed-out portion, thereby reducing the reflection of ambient light by the metal electrode. A sum of the transmissivity and the reflectivity is 100%, so the light-outgoing efficiency of the OLED display substrate may be increased, and the polarizer may not be required, thereby increasing the light utilization of the OLED display substrate. In addition, the luminance of the microcavity structure may change with the viewing angle, so people around the user cannot see the displayed content, thereby guaranteeing the privacy of the display.

Optionally, the hollowed-out portion is slit-like.

The anode and the light-emitting layer of the OLED display substrate are made of different materials, so there exists an interface between the anode and the light-emitting layer. At the interface, part of photons may be converted into surface plasmons and then propagated and dissipated on a surface of the anode. Optionally, the anode is of a Bragg diffraction grating structure, which is capable of abstracting the light beams dissipated in the form of plasmons, thereby further increasing the light-outgoing efficiency of the OLED display substrate.

Optionally, the light-emitting layers of the sub-pixel regions corresponding to different colors are of different thicknesses, and the anodes of the sub-pixel regions corresponding to different colors are of an identical thickness, or the light-emitting layers of the sub-pixel regions corresponding to different colors are of an identical thickness, and the anodes of the sub-pixel regions corresponding to different colors are of different thicknesses.

Optionally, the cathode may be of a grating structure. The cathode is configured to receive electrical signals, so the grating structure may still serve as the cathode without affecting the function of the cathode, as long as the grating structure is made of a conductive material. The grating structures of the sub-pixel regions corresponding to different colors are of different periods and widths. The width of the grating structure of each sub-pixel region is in direct proportion to a wave length of light of the color corresponding to the sub-pixel region, and the period of the grating structure of each sub-pixel region is in direct proportion to the wave length of light of the color corresponding to the sub-pixel region. Therefore, it is possible to generate light of different colors through the filtering of the grating structures with different periods and widths. Therefore, a color light blocking layer may not be required, and the display device may become thinner. The light emitted through the grating structure with a certain period may only be observed at a certain viewing angle, so the privacy of the displayed content may be improved by the cathode having the grating structure. In addition, the cathode itself also absorbs part of the light energy, so the cathode having the grating structure may reduce the absorption of the light energy, thereby further increasing the light-outgoing efficiency of the OLED display substrate.

The cathode and the light-emitting layer of the OLED display substrate are made of different materials, so there exists an interface between the cathode and the light-emitting layer. At the interface, part of photons may be converted into surface plasmons and then propagated and dissipated on a surface of the cathode. Optionally, the cathode is of a Bragg diffraction grating structure, which is capable of abstracting the light beams dissipated in the form of plasmons, thereby further increasing the light-outgoing efficiency of the OLED display substrate.

In some embodiments of the present disclosure, the plurality of sub-pixel regions corresponding to different colors arranged on the substrate includes a red sub-pixel region, a green sub-pixel region and a blue sub-pixel region.

The thickness of the light-emitting layer is related to a wave length of the light of the color corresponding to the light-emitting layer, namely the thickness of the light-emitting layer is in direct proportion to the wave length of the light of the color corresponding to the light-emitting layer, therefore a thickness A of the light-emitting layer of the red sub-pixel region is greater than a thickness B of the light-emitting layer of the green sub-pixel region, meanwhile the thickness B of the light-emitting layer of the green sub-pixel region is greater than a thickness C of the light-emitting layer of the blue sub-pixel region.

The thickness of the anode of the sub-pixel region is in direct proportion to the wave length of the light of the color corresponding to the sub-pixel region, therefore a thickness L of the anode of the red sub-pixel region is greater than a thickness M of the anode of the green sub-pixel region, meanwhile the thickness M of the anode of the green sub-pixel region is greater than a thickness N of the anode of the blue sub-pixel region.

In some embodiments, a width of the grating structure of the red sub-pixel region is greater than a width of the grating structure of the green sub-pixel region, and the width of the grating structure of the green sub-pixel region is greater than a width of the grating structure of the blue sub-pixel region. In addition, a period of the grating structure of the red sub-pixel region is greater than a period of the grating structure of the green sub-pixel region, and the period of the grating structure of the green sub-pixel region is greater than a period of the grating structure of the blue sub-pixel region.

Therefore, when the white light beams emitted from the light-emitting layer of the OLED display substrate enter into the red sub-pixel region, the grating structure of the red sub-pixel region may filter the white light beams so as to merely pass red light beams therethrough. Similarly, when the white light beams enter into the green sub-pixel region, the grating structure of the green sub-pixel region may merely pass green light beams therethrough, and when the white light beams enter into the blue sub-pixel region, the grating structure of the blue sub-pixel region may merely pass blue light beams there through. As a result, the filtering of the light beams of different colors is achieved, and the function of the color light blocking layer is achieved.

In some embodiments, the grating structure of each of the red sub-pixel region, the green sub-pixel region and the blue sub-pixel region has a width in a range from 80 nanometers to 300 nanometers and a period in a range from 200 nanometers to 500 nanometers. To be specific, the width of the grating structure of the red sub-pixel region may be 200 nanometers, the width of the grating structure of the green sub-pixel region may be 100 nanometers, and the width of the grating structure of the blue sub-pixel region may be 80 nanometers. The period of the grating structure of the red sub-pixel region may be 340 nanometers, the period of the grating structure of the green sub-pixel region may be 260 nanometers, and the period of the grating structure of the blue sub-pixel region may be 220 nanometers.

In some embodiments, in order to improve the light abstraction efficiency, a ratio of a depth of the grating structure of the red sub-pixel region to the width thereof is greater than a ratio of a depth of the grating structure of the green sub-pixel region to the width thereof, and the ratio of the depth of the grating structure of the green sub-pixel region to the width thereof is greater than a ratio of a depth of the grating structure of the blue sub-pixel region to the width thereof.

In some embodiments, the depth of the grating structure of each of the red sub-pixel region, the green sub-pixel region and the blue sub-pixel region is in a range from 80 nanometers to 200 nanometers.

The anode may be made of a metal material having a high work function and a large reflectivity (e.g., gold). The reflectivity of gold is 98%, and a thickness of the electrode may be in a range from 80 nanometers to 200 nanometers. Optionally, the anode is made of an alloy of silver and molybdenum having a large reflectivity.

A display device including the OLED display substrate hereinabove is further provided in some embodiments of the present disclosure. The display device may be any product or component having a display function, such as an OLED panel, a cell phone, a tablet PC, a television, a display, a laptop computer, a digital photo frame and a navigator.

An OLED display substrate is further provided in some embodiments of the present disclosure.

An OLED full-color display is mainly performed through RGB pixel emitting light independently and color filtering. The former utilizes a red (R) light-emitting material, a green (G) light-emitting material and a blue (B) light-emitting material which emit light independently. Through the former method, color saturation is high and luminance is high, while the manufacturing process is complicated and power consumption is high. The latter is as shown in FIG. 1, which is achieved by color filters 5 corresponding to three primary colors and an OLED display substrate emitting white light. In the manufacturing process of the latter method, a metal shadow mask alignment is not required, and a mature technology of manufacturing the color filter of a liquid crystal display (LCD) may be applied, which is applicable to a large-screen display, and a cost of the latter method is smaller than that of the former method.

As shown in FIG. 1, a thickness of the light-emitting layer in a pixel unit is uniform at different positions. Only the visible light at an optimum wave length may be enhanced, and color saturation is increased through the color filter. As a result, the display equipment may become thicker, the transitivity may be reduced, and the light utilization of the OLED display substrate may be reduced.

Figure 2:
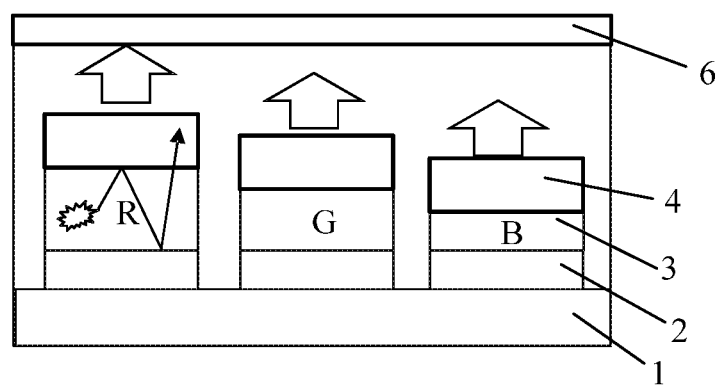
FIG. 2 is a schematic diagram of an OLED display substrate in some embodiments of the present disclosure.

In order to increase the light utilization of the OLED display substrate, as shown in FIG. 2, the OLED display substrate in some embodiments includes a first base substrate 1 and a second base substrate 6 opposite to each other, a red sub-pixel region, a green sub-pixel region and a blue sub-pixel region arranged on the base substrate 1. Each sub-pixel region includes a thin film transistor (TFT) (not shown), an anode 2, a light-emitting layer 3 and a cathode 4 successively arranged in a direction away from the substrate. A light-emitting layer of the red sub-pixel region is of a thickness A, a light-emitting layer of the green sub-pixel region is of a thickness B and a light-emitting layer of the blue sub-pixel region is of a thickness C, and A>B>C. To be specific, the anode 2 may be made of an alloy of silver and molybdenum having a large reflectivity. The anodes 2 of the red, green and blue sub-pixel regions are of an identical thickness. The cathode 4 may be made of a low work function metal material such as aluminum.

In some embodiments, different optical path lengths are designed for the emitting of the red, green and blue light, the light-emitting layers of the sub-pixel regions corresponding to different colors are of different thicknesses. In addition, the anode is provided with a hollowed-out portion. To be specific, the hollowed-out portion is slit-like, thereby reducing the reflection of ambient light by the metal electrode without the polarizer, increasing the light-outgoing efficiency of the OLED display substrate and then increasing the light utilization thereof. In addition, the luminance of the microcavity structure may change with the viewing angle, so people around the user cannot see the displayed content, thereby guaranteeing the privacy of the display.

The anode and the light-emitting layer of the OLED display substrate are made of different materials, so there exists an interface between the anode and the light-emitting layer. At the interface, part of photons may be converted into surface plasmons and then propagated and dissipated on a surface of the anode. Optionally, the anode is of a Bragg diffraction grating structure, which is capable of abstracting the light beams dissipated in the form of plasmons, thereby further increasing the light-outgoing efficiency of the OLED display substrate.

Figure 3:
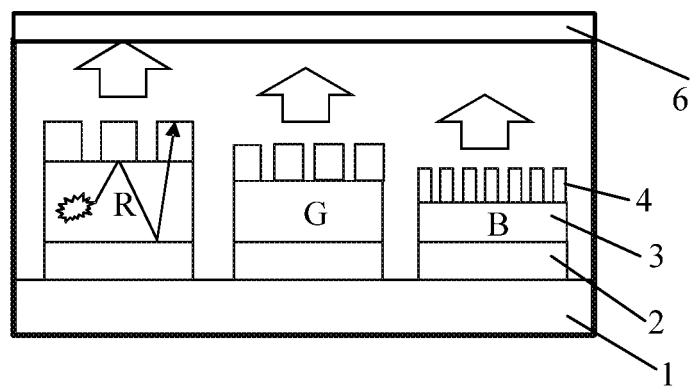
FIG. 3 is another schematic diagram of an OLED display substrate in some embodiments of the present disclosure.

Furthermore, as shown in FIG. 3, the cathode 4 may be of a grating structure, and it is possible to generate light of different colors through the filtering of the gratings with different periods and widths. Therefore, a color filter may not be required, the display device may become thinner, and the structure of the display device may be simplified. The light beams emitted through the grating structure with a certain period may only be observed at a certain viewing angle, so the privacy of the display may be improved by the cathode 4 having the grating structure. In addition, the cathode 4 itself also absorbs part of the light energy, and there however exists a hollowed out portion in the cathode having the grating structure, so the cathode 4 having the grating structure may reduce the absorption of the light energy, thereby further increasing the light-outgoing efficiency of the OLED display substrate.

In the OLED equipment, a total reflection occurs at an interface between air and the base substrate, an interface between the base substrate and the cathode, and an interface between the light-emitting layer and the cathode, so the energy of photons is trapped by means of waveguides in the base substrate, the cathode and the light-emitting layer. At the interface between the light-emitting layer and the cathode, part of photons may be converted into surface plasmons and then propagated and dissipated on a surface of the cathode. Optionally, the cathode may be designed as a Bragg diffraction grating, which is capable of abstracting the light beams dissipated in the form of plasmons, thereby further increasing the light-outgoing efficiency of the OLED display substrate.

To be specific, a width of the grating structure of the red sub-pixel region is greater than a width of the grating structure of the green sub-pixel region, and the width of the grating structure of the green sub-pixel region is greater than a width of the grating structure of the blue sub-pixel region. In addition, a period of the grating structure of the red sub-pixel region is greater than a period of the grating structure of the green sub-pixel region, and the period of the grating structure of the green sub-pixel region is greater than a period of the grating structure of the blue sub-pixel region. Therefore, when the white light beams emitted from the light-emitting layer of the OLED display substrate enter into the red, green and blue sub-pixel regions respectively, the grating structure of the red sub-pixel region may merely pass red light beams there through, the grating structure of the green sub-pixel region may merely pass green light beams there through, and the grating structure of the blue sub-pixel region may merely pass blue light beams there through.

To be specific, the grating structure of each of the red sub-pixel region, the green sub-pixel region and the blue sub-pixel region has a width in a range from 80 nanometers to 300 nanometers and a period in a range from 200 nanometers to 500 nanometers. To be specific, the width of the grating structure of the red sub-pixel region may be 200 nanometers, the width of the grating structure of the green sub-pixel region may be 100 nanometers, and the width of the grating structure of the blue sub-pixel region may be 80 nanometers. The period of the grating structure of the red sub-pixel region may be 340 nanometers, the period of the grating structure of the green sub-pixel region may be 260 nanometers, and the period of the grating structure of the blue sub-pixel region may be 220 nanometers.

Furthermore, in order to improve the light abstraction efficiency, a ratio of the depth of the grating structure of the red sub-pixel region to the width thereof is greater than a ratio of the depth of the grating structure of the green sub-pixel region to the width thereof, and the ratio of the depth of the grating structure of the green sub-pixel region to the width thereof is greater than a ratio of the depth of the grating structure of the blue sub-pixel region to the width thereof. To be specific, the depth of the grating structure of each of the red sub-pixel region, the green sub-pixel region and the blue sub-pixel region is in a range from 80 nanometers to 200 nanometers.

In the present embodiment, the OLED display substrate of the present disclosure is described with an example in which the OLED display substrate includes a red sub-pixel region, a green sub-pixel region and a blue sub-pixel region. Furthermore, the OLED display substrate may further be provided with sub-pixel regions corresponding to other colors, and the thicknesses of the light-emitting layers require adjustments if the sub-pixel regions corresponding to other colors are formed, so as to make the thicknesses of the light-emitting layers adapted to the wave lengths of the corresponding colors to form the corresponding microcavity structures. In addition, it is further required to adjust the periods and the widths of the grating structures of the cathodes, so as to generate light of the corresponding colors through the filtering of the grating structures.

Figure 4:
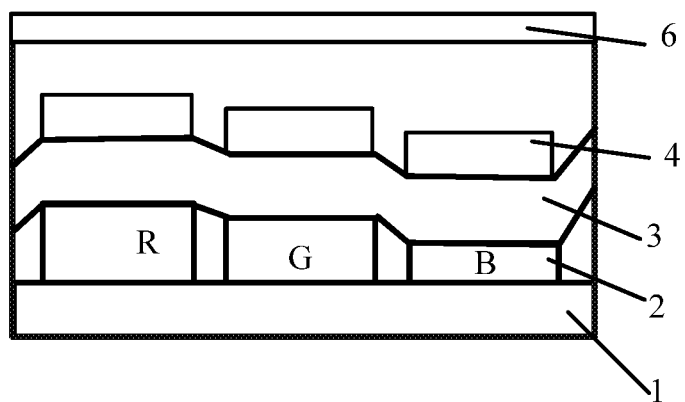
FIG. 4 is a schematic diagram of an OLED display substrate in some embodiments of the present disclosure.

In order to increase the light utilization of the OLED display substrate, as shown in FIG. 4, the OLED display substrate in some embodiments includes a first base substrate 1 and a second base substrate 6 opposite to each other. A red sub-pixel region, a green sub-pixel region and a blue sub-pixel region are arranged on the base substrate 1. Each sub-pixel region includes a TFT, an anode 2, a light-emitting layer 3 and a cathode 4 arranged successively in a direction away from the substrate. The light-emitting layers of different sub-pixel regions are of an identical thickness. A thickness of the anode of the red sub-pixel region is L, a thickness of the anode of the green sub-pixel region is M, and a thickness of the anode of the blue sub-pixel region is N, where L>M>N. To be specific, the anode 2 may be made of an alloy of silver and molybdenum, and the cathode 4 may be made of a low work function metal material such as of aluminum.

Figure 6:
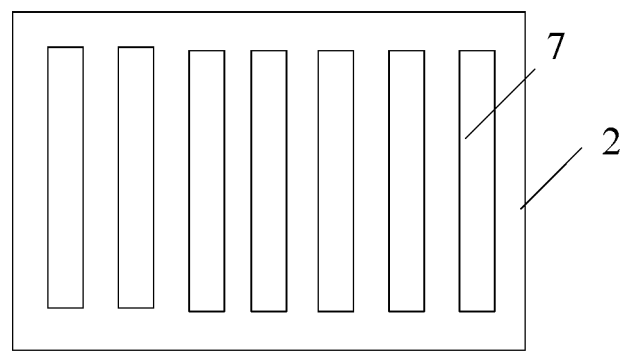
FIG. 6 is a planar view of an anode in some embodiments of the present disclosure.

In some embodiments, different optical path lengths are designed for the emitting of the red, green and blue light, and the light-emitting layers of the sub-pixel regions corresponding to different colors are of different thicknesses. In addition, the anode is provided with a hollowed-out portion. To be specific, as shown in FIG. 6, the hollowed-out portion 7 is slit-like, thereby reducing the reflection of ambient light by the metal electrode without the polarizer, increasing the light-outgoing efficiency of the OLED display substrate and then increasing the light utilization thereof. In addition, the luminance of the microcavity structure may change with the viewing angle, so people around the user cannot see the displayed content, thereby guaranteeing the privacy of the display.

The anode and the light-emitting layer of the OLED display substrate are made of different materials, so there exists an interface between the anode and the light-emitting layer. At the interface, part of photons may be converted into surface plasmons and then propagated and dissipated on a surface of the anode. Optionally, the anode is of a Bragg diffraction grating structure, which is capable of abstracting the light beams dissipated in the form of plasmons, thereby further increasing the light-outgoing efficiency of the OLED display substrate.

Figure 5:
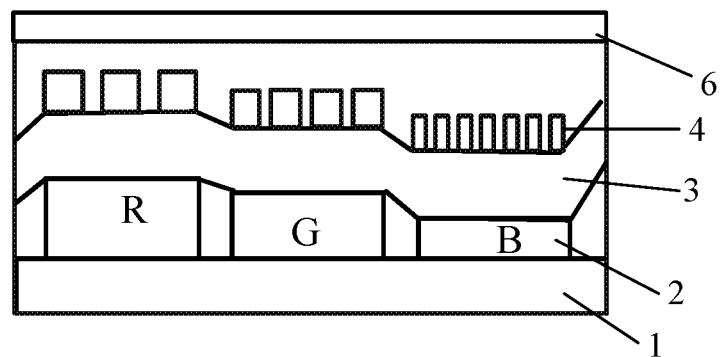
FIG. 5 is another schematic diagram of an OLED display substrate in some embodiments of the present disclosure.

Furthermore, as shown in FIG. 5, the cathode 4 may be of a grating structure, and is able to generate light of different colors through the filtering of the gratings with different periods and widths. Therefore, a color filter may not be required, and the display device may become thinner. The light emitted through the grating structure with a certain period may only be observed at certain viewing angles, so the privacy of the display may be improved by the cathode 4 having the grating structure. In addition, the cathode 4 itself also absorbs part of the light energy, and there however exists a hollowed-out portion in the cathode having the grating structure, so the cathode 4 having the grating structure may reduce the absorption of the light energy, thereby further increasing the light-outgoing efficiency of the OLED display substrate.

In the OLED equipment, a total reflection occurs at an interface between air and the base substrate, an interface between the base substrate and the cathode, an interface between the light-emitting layer and the cathode, so the energy of photons is trapped by means of waveguides in the base substrate, the cathode and the light-emitting layer. At the interface between the light-emitting layer and the cathode, part of photons may be converted into surface plasmons and then propagated and dissipated on a surface of the cathode. Therefore, the cathode may be designed to be of a Bragg diffraction grating structure, which is capable of abstracting the light beams dissipated in the form of plasmons, thereby further increasing the light-outgoing efficiency of the OLED display substrate.

To be specific, a width of the grating structure of the red sub-pixel region is greater than a width of the grating structure of the green sub-pixel region, and the width of the grating structure of the green sub-pixel region is greater than a width of the grating structure of the blue sub-pixel region. In addition, a period of the grating structure of the red sub-pixel region is greater than a period of the grating structure of the green sub-pixel region, and the period of the grating structure of the green sub-pixel region is greater than a period of the grating structure of the blue sub-pixel region. Therefore, when the white light beams emitted from the light-emitting layer of the OLED display substrate enter into the red, green and blue sub-pixel regions respectively, the grating structure of the red sub-pixel region may merely pass red light beams there through, the grating structure of the green sub-pixel region may merely pass green light beams there through, and the grating structure of the blue sub-pixel region may merely pass blue light beams there through.

To be specific, the grating structure of each of the red sub-pixel region, the green sub-pixel region and the blue sub-pixel region has a width in a range from 80 nanometers to 300 nanometers and a period in a range from 200 nanometers to 500 nanometers. To be specific, the width of the grating structure of the red sub-pixel region may be 200 nanometers, the width of the grating structure of the green sub-pixel region may be 100 nanometers, and the width of the grating structure of the blue sub-pixel region may be 80 nanometers. The period of the grating structure of the red sub-pixel region may be 340 nanometers, the period of the grating structure of the green sub-pixel region may be 260 nanometers, and the period of the grating structure of the blue sub-pixel region may be 220 nanometers.

Furthermore, in order to improve the light abstraction efficiency, a ratio of the depth of the grating structure of the red sub-pixel region to the width thereof is greater than a ratio of the depth of the grating structure of the green sub-pixel region to the width thereof, and the ratio of the depth of the grating structure of the green sub-pixel region to the width thereof is greater than a ratio of the depth of the grating structure of the blue sub-pixel region to the width thereof. To be specific, the depth of the grating structure of each of the red sub-pixel region, the green sub-pixel region and the blue sub-pixel region is in a range from 80 nanometers to 200 nanometers.

In the present embodiment, the OLED display substrate of the present disclosure is described with an example in which the OLED display substrate includes a red sub-pixel region, a green sub-pixel region and a blue sub-pixel region. Furthermore, the OLED display substrate may further be provided with sub-pixel regions corresponding to other colors, and the thicknesses of the light-emitting layers require adjustments if the sub-pixel regions corresponding to other colors are formed, so as to make the thicknesses of the light-emitting layers adapted to the wave lengths of the corresponding colors to form the corresponding microcavity structures. In addition, it is further required to adjust the periods and the widths of the grating structures of the cathodes, so as to generate light of the corresponding colors through the filtering of the grating structures.

The above are merely optional embodiments of the present disclosure. A person skilled in the art may make further modifications and improvements without departing from the principle of the present disclosure, and these modifications and improvements shall also fall within the scope of the present disclosure.

What is claimed is:

1. An organic light emitting diode (OLED) display substrate, comprising a plurality of sub-pixel regions corresponding to different colors formed on a substrate, wherein each of the plurality of sub-pixel regions comprises a thin film transistor (TFT), an anode, a light-emitting layer and a cathode arranged successively in a direction away from the substrate, and a microcavity structure is formed between the anode and the cathode, the anode comprises a hollowed-out portion, the light-emitting layers of the sub-pixel regions corresponding to different colors are of different thicknesses, or the anodes of the sub-pixel regions corresponding to different colors are of different thicknesses, wherein the hollowed-out portion is slit-like, and the anode is of a Bragg diffraction grating structure.

2. The OLED display substrate according to claim 1, wherein the light-emitting layers of the sub-pixel regions corresponding to different colors are of different thicknesses, and the anodes of the sub-pixel regions corresponding to different colors are of an identical thickness; or the light-emitting layers of the sub-pixel regions corresponding to different colors are of an identical thickness, and the anodes of the sub-pixel regions corresponding to different colors are of different thicknesses.

3. The OLED display substrate according to claim 2, wherein the anode is made of an alloy of silver and molybdenum.

4. The OLED display substrate according to claim 1, wherein the anode is of a grating structure, the grating structures of the sub-pixel regions corresponding to different colors are of different periods and widths, the width of the grating structure of the sub-pixel region is in direct proportion to a wave length of light of the color corresponding to the sub-pixel region, and the period of the grating structure of the sub-pixel region is in direct proportion to the wave length of light of the color corresponding to the sub-pixel region.

5. The OLED display substrate according to claim 4, wherein the cathode is of a Bragg diffraction grating structure.

6. The OLED display substrate according to claim 4, wherein the plurality of sub-pixel regions corresponding to different colors arranged on the substrate comprises a red sub-pixel region, a green sub-pixel region and a blue sub-pixel region, wherein the width of the grating structure of each of the red sub-pixel region, the green sub-pixel region and the blue sub-pixel region is in a range from 80 nanometers to 300 nanometers, and the period of the grating structure of each of the red sub-pixel region, the green sub-pixel region and the blue sub-pixel region is in a range from 200 nanometers to 500 nanometers.

7. The OLED display substrate according to claim 6, wherein a depth-width ratio of the grating structure of the red sub-pixel region is greater than a depth-width ratio of the grating structure of the green sub-pixel region, and the depth-width ratio of the grating structure of the green sub-pixel region is greater than a depth-width ratio of the grating structure of the blue sub-pixel region.

8. The OLED display substrate according to claim 7, wherein the grating structure of each of the red sub-pixel region, the green sub-pixel region and the blue sub pixel region is of a depth in a range from 80 nanometers to 200 nanometers.

9. The OLED display substrate according to claim 1, wherein the anode is made of an alloy of silver and molybdenum.

10. The OLED display substrate according to claim 1, wherein the anode is made of an alloy of silver and molybdenum.

11. A display device comprising an organic light emitting diode (OLED) display substrate, the OLED display substrate comprising a plurality of sub-pixel regions corresponding to different colors formed on a substrate, wherein each of the plurality of sub-pixel regions comprises a thin film transistor (TFT), an anode, a light-emitting layer and a cathode arranged successively in a direction away from the substrate, and a microcavity structure is formed between the anode and the cathode, the anode comprises a hollowed-out portion, the light-emitting layers of the sub-pixel regions corresponding to different colors are of different thicknesses, or the anodes of the sub-pixel regions corresponding to different colors are of different thicknesses, wherein the hollowed-out portion is slit-like, and the anode is of a Bragg diffraction grating structure.

12. An organic light emitting diode (OLED) display substrate, comprising a plurality of sub-pixel regions corresponding to different colors formed on a substrate, wherein each of the plurality of sub-pixel regions comprises a thin film transistor (TFT), an anode, a light-emitting layer and a cathode arranged successively in a direction away from the substrate, and a microcavity structure is formed between the anode and the cathode, the anode comprises a hollowed-out portion, the light-emitting layers of the sub-pixel regions corresponding to different colors are of different thicknesses, or the anodes of the sub-pixel regions corresponding to different colors are of different thicknesses, wherein the anode is of a grating structure, the grating structures of the sub-pixel regions corresponding to different colors are of different periods and widths, the width of the grating structure of the sub-pixel region is in direct proportion to a wave length of light of the color corresponding to the sub-pixel region, and the period of the grating structure of the sub-pixel region is in direct proportion to the wave length of light of the color corresponding to the sub-pixel region.

13. The OLED display substrate according to claim 12, wherein the cathode is of a Bragg diffraction grating structure.

14. The OLED display substrate according to claim 12, wherein the plurality of sub-pixel regions corresponding to different colors arranged on the substrate comprises a red sub-pixel region, a green sub-pixel region and a blue sub-pixel region, wherein the width of the grating structure of each of the red sub-pixel region, the green sub-pixel region and the blue sub-pixel region is in a range from 80 nanometers to 300 nanometers, and the period of the grating structure of each of the red sub-pixel region, the green sub-pixel region and the blue sub-pixel region is in a range from 200 nanometers to 500 nanometers.

15. The OLED display substrate according to claim 14, wherein a depth-width ratio of the grating structure of the red sub-pixel region is greater than a depth-width ratio of the grating structure of the green sub-pixel region, and the depth-width ratio of the grating structure of the green sub-pixel region is greater than a depth-width ratio of the grating structure of the blue sub-pixel region.

16. The OLED display substrate according to claim 15, wherein the grating structure of each of the red sub-pixel region, the green sub-pixel region and the blue sub pixel region is of a depth in a range from 80 nanometers to 200 nanometers.

17. The OLED display substrate according to claim 12, wherein the anode is made of an alloy of silver and molybdenum.

* * * * *